(12) United States Patent
Moon et al.

(10) Patent No.: US 9,390,862 B2
(45) Date of Patent: Jul. 12, 2016

(54) COMPOSITE ELECTRONIC COMPONENT AND BOARD WITH THE SAME MOUNTED THEREON

(71) Applicant: SAMSUNG ELECTRO-MECHANICS CO., LTD., Suwon-Si, Gyeonggi-Do (KR)

(72) Inventors: Byeong Cheol Moon, Suwon-Si (KR); Jae Hoon Lee, Suwon-Si (KR); Myeong Gi Kim, Suwon-Si (KR); Jin Woo Hahn, Suwon-Si (KR); Soo Hwan Son, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 131 days.

(21) Appl. No.: 14/275,469

(22) Filed: May 12, 2014

(65) Prior Publication Data

US 2015/0213960 A1 Jul. 30, 2015

(30) Foreign Application Priority Data

Jan. 27, 2014 (KR) ........................ 10-2014-0009382

(51) Int. Cl.
*H01G 4/40* (2006.01)
*H01G 4/30* (2006.01)
(Continued)

(52) U.S. Cl.
CPC ............... *H01G 4/40* (2013.01); *H01F 27/292* (2013.01); *H01F 27/40* (2013.01); *H01G 2/065* (2013.01);
(Continued)

(58) Field of Classification Search
CPC ........... H01G 4/012; H01G 4/12; H01G 4/30; H01G 4/40; H01G 4/248; H01G 2/065; H01F 27/2804; H01F 27/292; H01F 27/24; H05K 1/111; H05K 1/181; H05K 2201/10015; H05K 2201/1003
USPC ........................................................ 361/270
See application file for complete search history.

(56) References Cited

U.S. PATENT DOCUMENTS

| 4,746,557 A * | 5/1988 | Sakamoto ............... B32B 18/00 |
| | | 174/256 |
| 4,821,005 A * | 4/1989 | Kling ................... H05K 1/0231 |
| | | 333/12 |

(Continued)

FOREIGN PATENT DOCUMENTS

| JP | 01-126173 A | 5/1989 |
| JP | 08-167522 A | 6/1996 |

(Continued)

OTHER PUBLICATIONS

Korean Notice of Office Action issued in corresponding Korean Patent Application No. 10-2014-0009382, mailed on Jan. 30, 2015; 12 pages with English translation.

(Continued)

*Primary Examiner* — Thienvu Tran
*Assistant Examiner* — Kevin J Comber
(74) *Attorney, Agent, or Firm* — McDermott Will & Emery LLP

(57) ABSTRACT

A composite electronic component may include: a composite body having a capacitor and an inductor coupled to each other therein; an input terminal disposed on a first end surface of the composite body; output terminals including a first output terminal disposed on a second end surface of the composite body and a second output terminal disposed on a lower surface of the capacitor of the composite body; and a ground terminal disposed on the lower surface of the capacitor of the composite body. The capacitor may be coupled to a side surface of the inductor.

19 Claims, 11 Drawing Sheets

(51) Int. Cl.
*H01G 4/12* (2006.01)
*H01G 4/012* (2006.01)
*H05K 1/18* (2006.01)
*H01F 27/28* (2006.01)
*H01F 27/29* (2006.01)
*H01F 27/24* (2006.01)
*H05K 1/11* (2006.01)
*H01G 2/06* (2006.01)
*H01G 4/248* (2006.01)
*H01F 27/40* (2006.01)

(52) U.S. Cl.
CPC .............. *H01G 4/012* (2013.01); *H01G 4/12* (2013.01); *H01G 4/248* (2013.01); *H01G 4/30* (2013.01); *H05K 1/111* (2013.01); *H05K 1/181* (2013.01); *H05K 2201/1003* (2013.01); *H05K 2201/10015* (2013.01); *Y02P 70/611* (2015.11)

(56) References Cited

U.S. PATENT DOCUMENTS

| | | | |
|---|---|---|---|
| 5,602,517 A * | 2/1997 | Kaneko | H03H 7/0115 333/185 |
| 6,438,000 B1 | 8/2002 | Okamoto et al. | |
| 6,448,873 B1 * | 9/2002 | Mostov | H01F 17/0006 333/184 |
| 7,310,217 B2 * | 12/2007 | Takashima | H01G 4/385 361/306.1 |
| 2001/0037895 A1 * | 11/2001 | Gotoh | H01G 4/228 174/250 |
| 2003/0030510 A1 | 2/2003 | Sasaki et al. | |
| 2008/0186652 A1 * | 8/2008 | Lee | H01G 4/012 361/306.3 |
| 2014/0220364 A1 * | 8/2014 | Umemoto | C03C 14/00 428/434 |

FOREIGN PATENT DOCUMENTS

| | | |
|---|---|---|
| JP | 11-87793 A | 3/1999 |
| JP | 2001-176728 A | 6/2001 |
| JP | 2004-095680 A | 3/2004 |
| JP | 3680627 B2 | 8/2005 |
| JP | 2007-335764 A | 12/2007 |
| JP | 2008-193055 A | 8/2008 |
| JP | 2011-061190 A | 3/2011 |
| KR | 2003-0014586 A | 2/2003 |

OTHER PUBLICATIONS

Notice of Office Action issued in corresponding Japanese Patent Application No. 2014-097012, mailed on Sep. 1, 2015; with English translation.

* cited by examiner

COMPOSITE ELECTRONIC COMPONENT AND BOARD WITH THE SAME MOUNTED THEREON

CROSS-REFERENCE TO RELATED APPLICATION

This application claims the benefit of Korean Patent Application No. 10-2014-0009382 filed on Jan. 27, 2014, with the Korean Intellectual Property Office, the disclosure of which is incorporated herein by reference.

BACKGROUND

The present disclosure relates to a composite electronic component including a plurality of passive elements and a board with the same mounted thereon.

In accordance with the recent trend toward compactness and slimness of electronic devices and high functionalization in the electronic devices, demands have been made for the electronic devices to be miniaturized and multi-functionalized.

The electronic devices as described above may include a power semiconductor based power management integrated circuit (PMIC) serving to efficiently control and manage a limited battery resource in order to satisfy various service requirements.

However, as electronic devices have multi-functionalized, the number of direct current (DC)/DC converters included in the PMIC has increased, and the number of passive elements that should be included in a power input terminal and a power output terminal of the PMIC has also increased.

In this case, since an area in which components of the electronic devices are disposed may inevitably increased, the miniaturization of the electronic devices may be restricted.

Further, noise may be significantly generated by wiring patterns of the PMIC and peripheral circuits thereof.

In order to solve the above-mentioned problems, research into a composite electronic component having an inductor and a capacitor coupled to each other in a vertical direction has been conducted, such that an area in which components of the electronic devices are disposed may be decreased, and generation of noise may be suppressed.

However, in the case of vertically arranging the inductor and the capacitor as described above, the inductor affect an internal electrode of the capacitor to generate parasitic capacitance, such that a self resonant frequency (SRF) may move to a low frequency region.

Meanwhile, in accordance with the miniaturization of the composite electronic component, an internal magnetic layer blocking a magnetic field of the inductor is also thinned, to cause deterioration in Q factor.

RELATED ART DOCUMENT (Patent Document 1) Korean Patent Laid-Open Publication No. 2003-0014586

SUMMARY

An aspect of the present disclosure may provide a composite electronic component requiring a reduced mounting area in a driving power supplying system, and a board having the same mounted thereon.

An aspect of the present disclosure may also provide a composite electronic component capable of suppressing the occurrence of noise in a driving power supplying system, and a board having the same mounted thereon.

According to an aspect of the present disclosure, a composite electronic component may include: a composite body having a capacitor and an inductor coupled to each other therein, the capacitor including a ceramic body in which a plurality of dielectric layers and first and second internal electrodes facing each other with the dielectric layers interposed therebetween are stacked, and the inductor including a magnetic body including a coil part; an input terminal disposed on a first end surface of the composite body and connected to the coil part of the inductor; output terminals including a first output terminal disposed on a second end surface of the composite body and connected to the coil part of the inductor and a second output terminal disposed on a lower surface of the capacitor of the composite body and connected to a lead portion of the first internal electrode of the capacitor; and a ground terminal disposed on the lower surface of the capacitor of the composite body and connected to a lead portion of the second internal electrode of the capacitor, wherein the capacitor is coupled to a side surface of the inductor.

The magnetic body may have a form in which a plurality of magnetic layers having conductive patterns disposed thereon are stacked, the conductive patterns configuring the coil part.

The inductor may have a thin film form in which the magnetic body includes an insulating substrate and a coil disposed on at least one surface of the insulating substrate.

The magnetic body may have a form in which a core and a winding coil wound around the core are provided.

The inductor may be a power inductor.

The capacitor and the inductor may be connected to each other by a conductive adhesive.

According to another aspect of the present disclosure, a composite electronic component may include: a composite body having a capacitor and an inductor coupled to each other therein, the capacitor including a ceramic body in which a plurality of dielectric layers and first and second internal electrodes facing each other with the dielectric layers interposed therebetween are stacked, and the inductor including a magnetic body including a coil part; an input terminal disposed on a first end surface of the composite body and connected to the coil part of the inductor; output terminals including a first output terminal disposed on a second end surface of the composite body and connected to the coil part of the inductor and second output terminals disposed on upper and lower surfaces of the capacitor of the composite body and connected to lead portions of the first internal electrode of the capacitor; and ground terminals disposed on the upper and lower surfaces of the capacitor of the composite body and connected to lead portions of the second internal electrode of the capacitor, wherein the capacitor is coupled to a side surface of the inductor.

The first internal electrode may have the lead portions exposed to the upper and lower surfaces of the capacitor, and the second internal electrode may have the lead portions exposed to the upper and lower surfaces of the capacitor.

The magnetic body may have a form in which a plurality of magnetic layers having conductive patterns disposed thereon are stacked, the conductive patterns configuring the coil part.

The inductor may have a thin film form in which the magnetic body includes an insulating substrate and a coil disposed on at least one surface of the insulating substrate.

The magnetic body may have a form in which a core and a winding coil wound around the core are provided.

The inductor may be a power inductor.

The capacitor and the inductor may be connected to each other by a conductive adhesive.

According to another aspect of the present disclosure, a composite electronic component may include: an input terminal receiving power converted by a power managing unit; a power stabilizing unit stabilizing the power and including a composite body having a capacitor and an inductor coupled to each other therein, the capacitor including a ceramic body in which a plurality of dielectric layers and first and second internal electrodes facing each other with the dielectric layers interposed therebetween are stacked, the inductor including a magnetic body including a coil part, and the capacitor being coupled to a side surface of the inductor; output terminals supplying the stabilized power; and at least one ground terminal for grounding.

The input terminal may be disposed on a first end surface of the composite body, the output terminals may include a first output terminal disposed on a second end surface of the composite body and connected to the coil part of the inductor and a second output terminal disposed on a lower surface of the capacitor of the composite body and connected to the first internal electrode of the capacitor, and the at least one ground terminal may be disposed on the lower surface of the capacitor of the composite body and connected to the second internal electrode of the capacitor.

The input terminal may be disposed on a first end surface of the composite body, the output terminals may include a first output terminal disposed on a second end surface of the composite body and connected to the coil part of the inductor and second output terminals disposed on upper and lower surfaces of the capacitor of the composite body and connected to the first internal electrode of the capacitor, and the at least one ground terminal is disposed on the upper and lower surfaces of the capacitor of the composite body and connected to the second internal electrode of the capacitor.

According to another aspect of the present disclosure, a board having a composite electronic component mounted thereon may include: a printed circuit board having three or more electrode pads disposed thereon; the composite electronic component as described above mounted on the printed circuit board; and soldering parts connecting the electrode pads and the composite electronic component.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
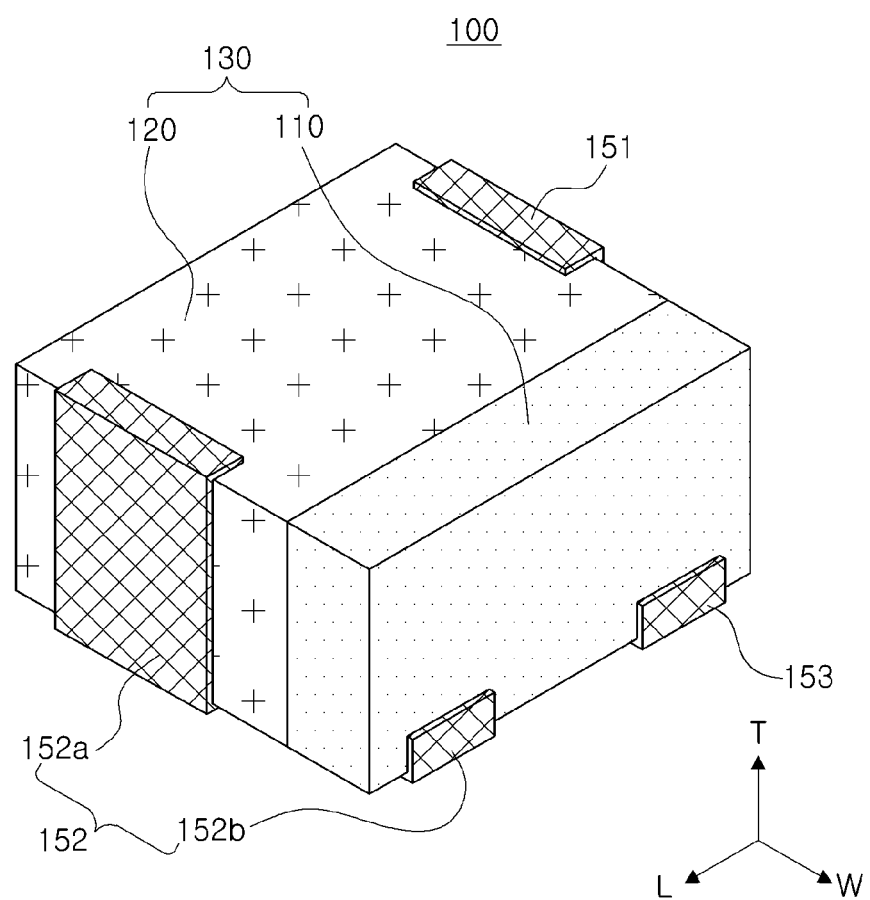
FIG. 1 is a perspective view schematically showing a composite electronic component according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Composite Electronic Component

FIG. 1 is a perspective view schematically showing a composite electronic component according to an exemplary embodiment of the present disclosure.

Referring to FIG. 1, in the composite electronic component according to the exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1.

Meanwhile, the length direction, the width direction, and the thickness direction of the composite electronic component may be defined as being the same as those of a capacitor and an inductor to be described below.

In addition, in an exemplary embodiment of the present disclosure, the composite electronic component may have upper and lower surfaces opposing each other, and first and second side surfaces and first and second end surfaces connecting the upper and lower surfaces to each other. A shape of the composite electronic component is not particularly limited, but may be a hexahedral shape as shown.

Further, the first and second side surfaces and the first and second end surfaces of the composite electronic component may be defined as being the same as those of a capacitor and an inductor to be described below.

Meanwhile, the composite electronic component may have a form in which the capacitor and the inductor are coupled to each other. In a case in which the capacitor is coupled to the side surface of the inductor, an upper surface of the composite electronic component refers to an upper surface of the inductor and the capacitor, and a lower surface of the composite electronic component refers to a lower surface of the inductor and the capacitor.

In addition, the first and second side surfaces refer to surfaces of the composite electronic component opposing each other in the width direction, the first and second end surfaces refer to surfaces of the composite electronic component opposing each other in the length direction, and the upper and lower surfaces refer to surfaces of the composite electronic component opposing each other in the thickness direction.

Figure 2:
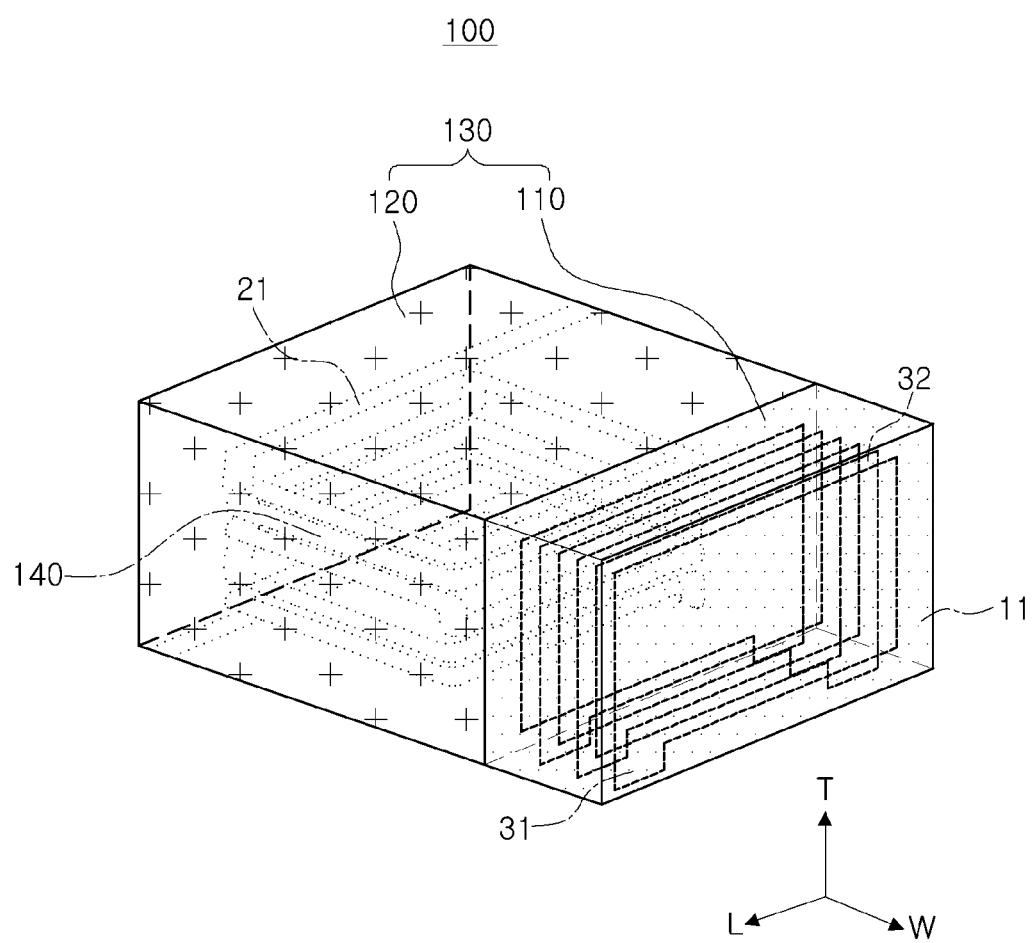
FIG. 2 is a schematic perspective view showing a first example of an interior of the composite electronic component shown in FIG. 1.
Figure 3:
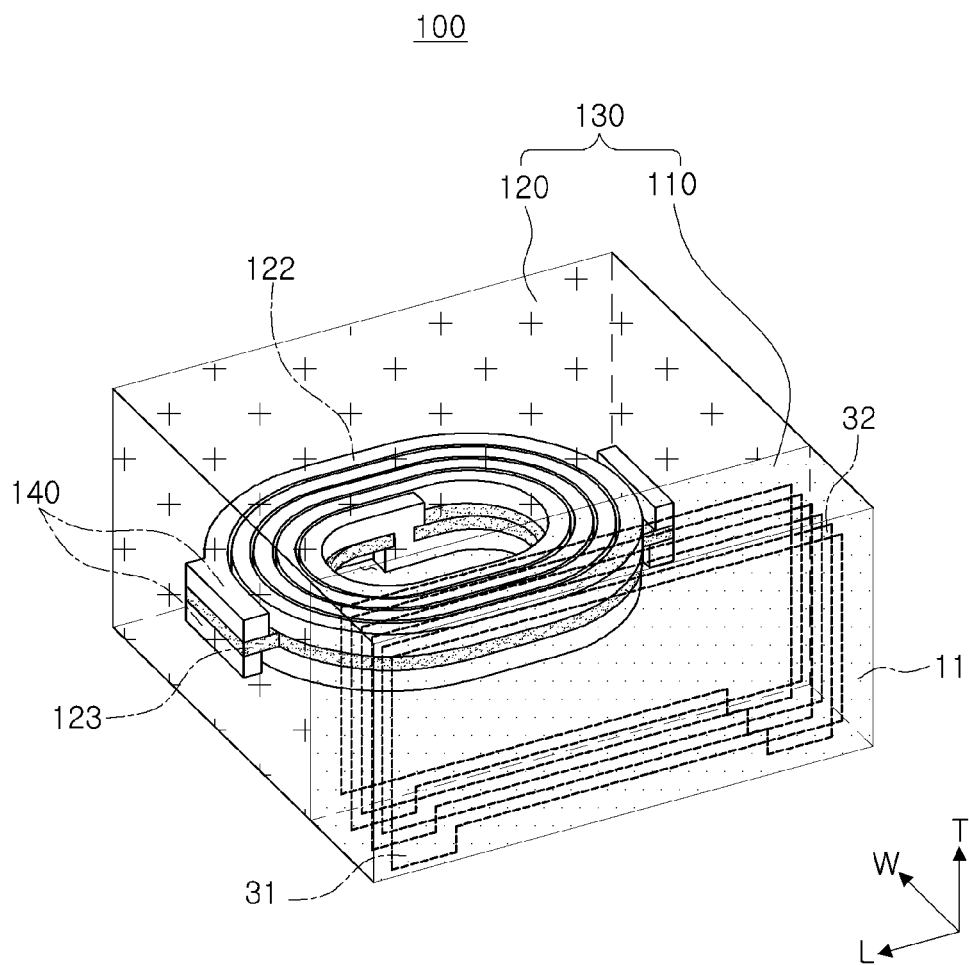
FIG. 3 is a schematic perspective view showing a second example of the interior of the composite electronic component of FIG. 1.

Referring to FIGS. 1 through 3, a composite electronic component 100 according to an exemplary embodiment of the present disclosure may include a composite body 130 having a capacitor 110 and an inductor 120 coupled to each other therein, the capacitor 110 including a ceramic body in which a plurality of dielectric layers 11 and first and second internal electrodes 31 and 32 facing each other with the dielectric layers 11 interposed therebetween are stacked, and the inductor 120 including a magnetic body including a coil part 140.

In the exemplary embodiment of the present disclosure, the composite body 130 may have upper and lower surfaces opposing each other, and first and second side surfaces and first and second end surfaces connecting the upper and lower surfaces to each other.

A shape of the composite body 130 is not particularly limited, but may be a hexahedral shape as shown in the exemplary embodiment.

The composite body 130 may be formed by coupling the capacitor 110 and the inductor 120 to each other. However, a method of forming the composite body 130 is not particularly limited.

For example, the composite body 130 may be formed by coupling the capacitor 110 and the inductor that are separately manufactured using a conductive adhesive, a resin, or the like, but the present invention is not particularly limited thereto.

Particularly, an adhesive or a resin used to couple the capacitor 110 and the inductor 120 to each other may be, for example, an epoxy resin, but is not limited thereto.

A method of coupling the capacitor 110 and the inductor 120 to each other using the conductive adhesive, the resin, or the like, is not particularly limited. That is, the capacitor 110 and the inductor 120 may be coupled to each other by applying the conductive adhesive, the resin, or the like, to a coupling surface of the capacitor 110 or the inductor 120 and then, heating and curing the same.

Meanwhile, according to an exemplary embodiment of the present disclosure, the capacitor 110 may be coupled to the side surface of the inductor 120, but is not limited thereto. The capacitor 110 may be disposed in various forms.

Hereinafter, the capacitor 110 and the inductor 120 configuring the composite body 130 will be described in detail.

According to an exemplary embodiment of the present disclosure, the magnetic body configuring the inductor 120 may include the coil part 140.

The inductor 120 is not particularly limited, but may be, for example, a multilayer type inductor, a thin film type inductor, or a winding type inductor. In addition to the above-mentioned inductors, a laser helixing type inductor may also be used as the inductor 120.

The multilayer type inductor may be manufactured by thickly printing electrodes on thin ferrite or glass ceramic sheets, stacking several sheets on which coil patterns are printed, and connecting internal conducting wires to each other through via-holes.

The thin film type inductor may be manufactured by forming conductive coil wires on a ceramic substrate by a thin film sputtering method or a plating method and then performing a filling of a ferrite material.

The winding type inductor may be manufactured by winding wires (conductive coil wires) around a core.

The laser helixing type inductor may be manufactured by forming an electrode layer on a ceramic bobbin through a sputtering or plating method, forming a coil shape by laser helixing, covering the coil shape with an external protection film resin, and then forming an external terminal.

Referring to FIG. 2, in the first example of the composite electronic component of the exemplary embodiment of the present disclosure, the inductor 120 may be the multilayer type inductor.

More specifically, the magnetic body may have a form in which a plurality of magnetic layers 21 having conductive patterns 41 formed thereon are stacked, and the conductive patterns 41 may configure the coil part 140.

Referring to FIG. 3, in the second example of the composite electronic component of the exemplary embodiment of the present disclosure, the inductor 120 may be the thin film type inductor.

By way of example, the inductor 120 may have a thin film form in which the magnetic body includes an insulating substrate 123 and a coil formed on at least one surface of the insulating substrate 123.

The magnetic body may be formed by filling upper and lower portions of the insulating substrate 123 having the coil formed on at least one surface thereof with a magnetic material 122.

Figure 4:
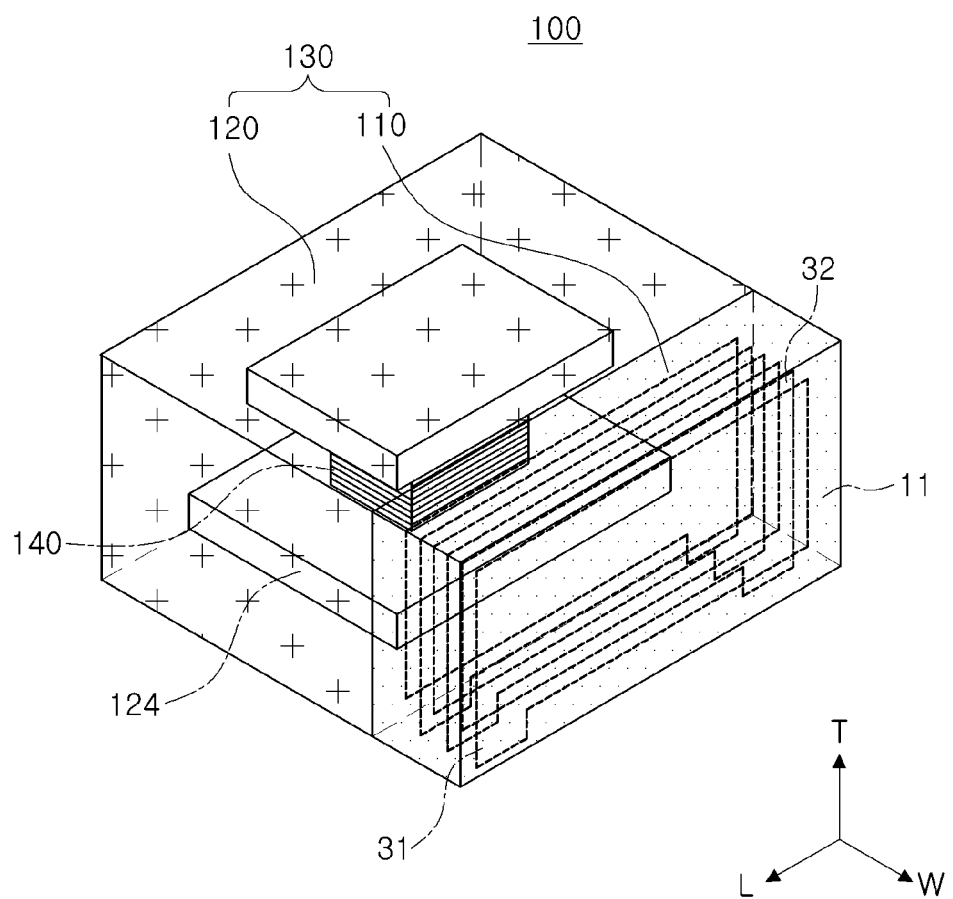
FIG. 4 is a schematic perspective view showing a third example of the interior of the composite electronic component of FIG. 1.

Referring to FIG. 4, in the third example of the composite electronic component of the exemplary embodiment of the present disclosure, the inductor 120 may be the wiring type inductor.

By way of example, the inductor 120 may have a form in which the magnetic body includes a core 124 and a winding coil wound around the core 124.

Referring to FIGS. 2 through 4, the first and second internal electrodes 31 and 32 of the capacitor 110 are stacked while they are disposed to be perpendicular with respect to a mounting surface of the composite electronic component, but are not limited thereto.

The magnetic layer 21 and the magnetic material 122 may be formed of a Ni—Cu—Zn based material, a Ni—Cu—Zn—Mg based material, a Mn—Zn based material, or a ferrite based material, but the present disclosure is not limited thereto.

According to an exemplary embodiment of the present disclosure, the inductor 120 may be a power inductor that may be applied to a large amount of current.

The power inductor may be a high efficiency inductor having an inductance change lower than that of a general inductor when direct current (DC) is applied thereto. That is, it may be considered that the power inductor includes DC bias characteristics (inductance change at the time of applying the DC current thereto) as well as functions of a general inductor.

That is, the composite electronic component according to the exemplary embodiment of the present disclosure may be used in a power management integrated circuit (PMIC) and may include the power inductor, a high efficiency inductor having an inductance change lower than that of a general inductor when the DC current is applied thereto.

Meanwhile, the ceramic body configuring the capacitor 110 may be formed by stacking the plurality of dielectric layers 11 and a plurality of internal electrodes 31 and 32 (first and second internal electrodes sequentially disposed) may be disposed in the ceramic body to be spaced apart from each other with the dielectric layers interposed therebetween.

The dielectric layers 11 may be formed by sintering ceramic green sheets containing a ceramic powder, an organic solvent, and an organic binder. The ceramic powder, a high k material, may be a barium titanate ($BaTiO_3$) based material, a strontium titanate ($SrTiO_3$) based material, or the like, but is not limited thereto.

Meanwhile, according to an exemplary embodiment of the present disclosure, the first and second internal electrodes 31 and 32 may be exposed to the lower surface of the capacitor 110 of the composite body 130, but are not limited thereto.

The first internal electrode 31 may have a lead portion 31a exposed to the lower surface of the capacitor 110, and the second internal electrode 32 may have a lead portion 32a exposed to the lower surface of the capacitor 110.

According to an exemplary embodiment of the present disclosure, the first and second internal electrodes 31 and 32 may be formed of a conductive paste containing a conductive metal.

The conductive metal may be nickel (Ni), copper (Cu), palladium (Pd), or an alloy thereof, but is not limited thereto.

The first and second internal electrodes 31 and 32 may be printed on ceramic green sheets forming the dielectric layers 11 using a conductive paste by a printing method such as a screen printing method, or a gravure printing method.

The ceramic green sheets having the internal electrodes printed thereon may be alternately stacked and sintered, thereby forming the ceramic body.

Figure 5:
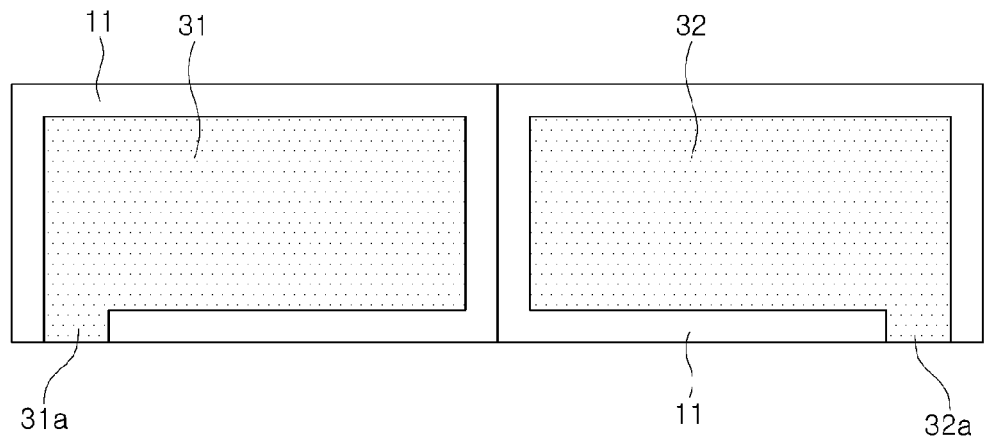
FIG. 5 is a plan view showing an internal electrode applicable to a multilayer ceramic capacitor of the composite electronic component shown in FIG. 1.

Although FIG. 5 illustrates pattern shapes of the first and second internal electrodes 31 and 32, the pattern shapes are not limited to the examples illustrated in FIG. 5, but may be variously changed.

The capacitor may serve to control voltage supplied from the power management integrated circuit (PMIC).

The composite electronic component 100 according to an exemplary embodiment of the present disclosure may include an input terminal 151 formed on the first end surface of the composite body 130 and connected to the coil part 140 of the inductor 120; output terminals 152 including a first output terminal 152a formed on the second end surface of the composite body 130 and connected to the coil part 140 of the inductor 120 and a second output terminal 152b formed on the lower surface of the capacitor of the composite body 130 and connected to the lead portion 31a of the first internal electrode 31; and a ground terminal 153 formed on the lower surface of the capacitor 110 of the composite body 130 and connected to the lead portion 32a of the second internal electrode 32 of the capacitor 110.

The input terminal 151 and the first output terminal 152a may be connected to the coil part 140 of the inductor 120, such that they serve as an inductor in the composite electronic component.

Further, the second output terminal 152b may be connected to the first internal electrode 31 of the capacitor 110, and the second internal electrode 32 of the capacitor 110 may be connected to the ground terminal 153, such that they serve as a capacitor in the composite electronic component.

The input terminal 151, the output terminals 152, and the ground terminal 153 may be formed using a conductive paste containing a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming the input terminal 151, the output terminal 152, and the ground terminal 153 is not particularly limited. That is, input terminal 151, the output terminal 152, and the ground terminal 153 may be formed by dipping the ceramic body or be formed by other methods such as a printing method, a plating method, and the like.

The second output terminal 152b may be extended from the lower surface of the capacitor 110 to the side surface thereof, and the ground terminal 153 may also be extended from the lower surface of the capacitor 110 to the side surface thereof.

Figure 6:
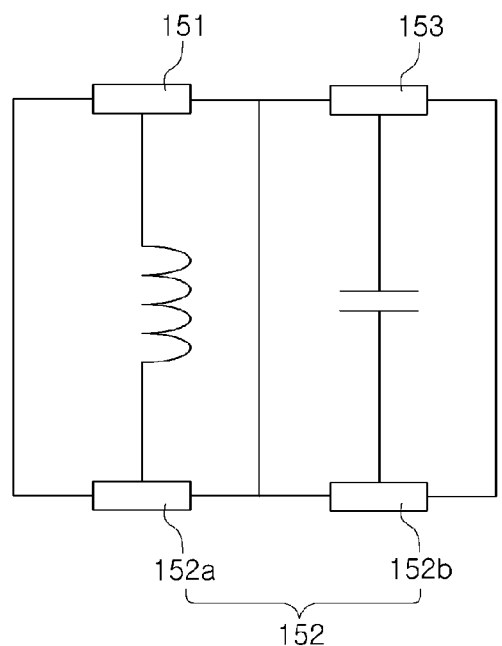
FIG. 6 is an equivalent circuit diagram of the composite electronic component shown in FIG. 1.

FIG. 6 is an equivalent circuit diagram of the composite electronic component shown in FIG. 1.

Referring to FIG. 6, the composite electronic component according to an exemplary embodiment of the present disclosure may include the inductor 120 and the capacitor 110 coupled to each other, unlike in the case of the related art. Therefore, the inductor 120 and the capacitor 110 may be designed to have the shortest distance therebetween, to thereby allow for a reduction in noise.

In addition, the inductor 120 and the capacitor 110 may be coupled to each other, such that an area in which they are mounted in the power management integrated circuit (PMIC) may be significantly decreased, whereby the securing of amounting space may be facilitated.

In addition, a cost required for mounting the inductor 120 and the capacitor 110 may be decreased.

Meanwhile, as electronic devices have multi-functionalized, the number of direct current (DC)/DC converters included in the PMIC has increased, and the number of passive elements that need to be included in a power input terminal and a power output terminal of the PMIC has also increased.

In this case, since an area in which components of the electronic devices are disposed may inevitably increased, the miniaturization of the electronic devices may be restricted.

Further, noise may be significantly generated by wiring patterns of the PMIC and peripheral circuits thereof.

In order to solve the above-mentioned defects, research into a composite electronic component having an inductor and a capacitor coupled to each other in a vertical direction has been conducted, such that an area in which components of the electronic devices are disposed may be decreased, and the occurrence of noise may be suppressed.

However, in the case of vertically arranging the inductor and the capacitor as described above, the inductor may affect an internal electrode of the capacitor to generate parasitic capacitance, such that a self resonant frequency (SRF) may move to a low frequency region.

In a case in which the self resonant frequency (SRF) is within the low frequency region as described above, a frequency region of the inductor usable in the composite electronic component according to an exemplary embodiment of the present disclosure may be decreased.

That is, since functions of the inductor are not exhibited in a high frequency region equal to or higher than the self resonant frequency (SRF), in a case in which the self resonant frequency (SRF) is within the low frequency region, a usable frequency region may be limited.

However, according to an exemplary embodiment of the present disclosure, since the capacitor 110 may be coupled to the side surface of the inductor 120, the influence of the inductor on the internal electrode of the capacitor may be significantly decreased, thereby preventing a change in the self resonant frequency (SRF).

That is, according to an exemplary embodiment of the present disclosure, since the inductor 120 and the capacitor 110 may be designed to have the shortest distance therebetween, to thereby allow for a reduction in noise, and the change in the self resonant frequency (SRF) may be prevented, such that a range of the inductor capable of being used in a low frequency region may not be limited.

Meanwhile, as the composite electronic component is miniaturized, an internal magnetic layer blocking a magnetic field of the inductor is also thinned to cause a decrease in Q factor.

The Q factor may refer to loss in an element or a decrease in efficiency of the element, and loss in an element may be reduced and efficiency of the element may be increased in accordance with an increase in Q value.

That is, according to an exemplary embodiment of the present disclosure, the capacitor 110 is coupled to the side surface of the inductor 120, such that mutual influences between the respective components may be significantly decreased, thereby preventing a decrease in Q factor.

Meanwhile, according to an exemplary embodiment of the present disclosure, external electrodes of the capacitor 110, that is, the second output terminal 152b and the ground terminal 153 are disposed on the lower surface of the capacitor 110, such that parasitic capacitance generated between the inductor 120 and the capacitor 110 may be significantly decreased, thereby significantly decreasing a degradation in electrical properties of the composite electronic component.

In the electrical properties of the composite electronic component, the self resonant frequency (SRF) may be changed to a low frequency due to parasitic capacitance generated between the inductor 120 and the capacitor 110, and as described above, a method of blocking a change in the self resonant frequency may be required.

To this end, a degradation in the electrical properties of the composite electronic component may be prevented by coupling the capacitor 110 to the side surface of the inductor 120, but in order to further significantly decrease the generation of the parasitic capacitance, the inductor and the external electrodes of the capacitor need to be maximally spaced apart from each other.

Therefore, as in an exemplary embodiment of the present disclosure, in a case in which the external electrodes of the capacitor 110, that is, the second output terminal 152b and the ground terminal 153 are disposed on the lower surface of the capacitor 110, since the inductor 120 and the external electrodes of the capacitor 110 may be maximally spaced apart from each other, the occurrence of parasitic capacitance between the inductor 120 and the capacitor 110 may be further significantly decreased.

Therefore, a degradation in the electrical properties of the composite electronic component may be significantly decreased.

Meanwhile, in the composite electronic component according to an exemplary embodiment of the present disclosure, as described above, since the external electrodes of the capacitor, that is, the second output terminal 152b and the ground terminal 153 are disposed on the lower surface of the capacitor, a different color of marker having no influence on the electrical properties of the composite electronic component may be printed on a cover part of the capacitor 110 in order to set a mounting direction.

The composite electronic component may be mounted while the mounting direction thereof is discernible using the marker.

Figure 7:
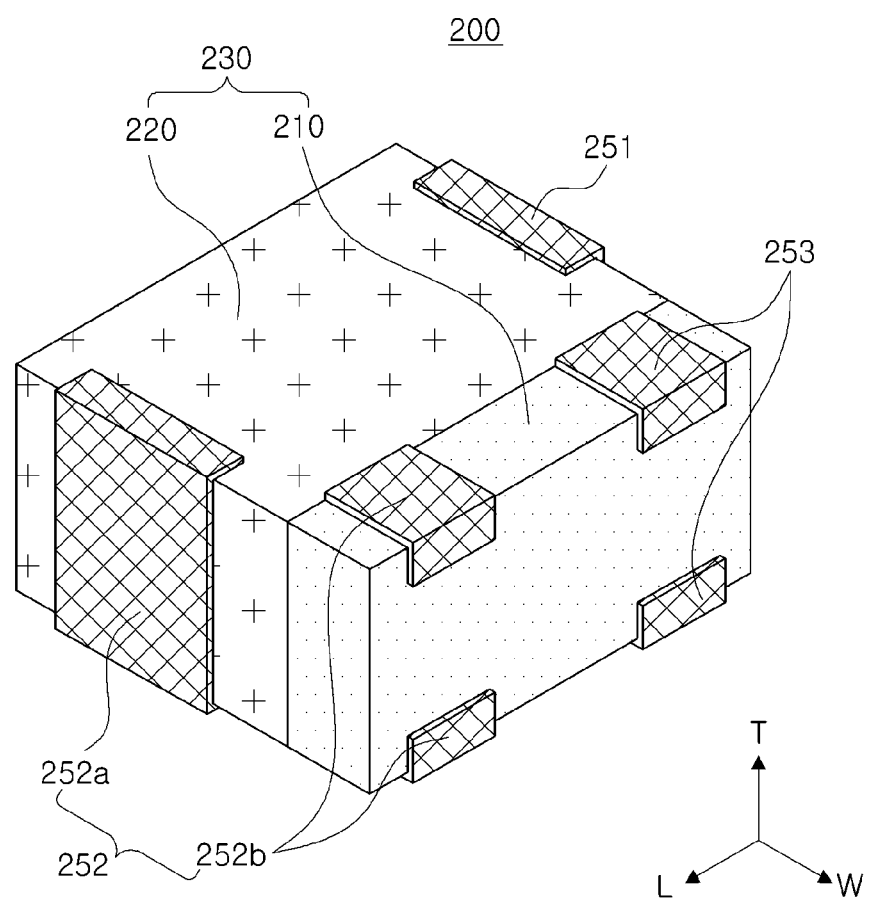
FIG. 7 is a perspective view schematically showing a composite electronic component according to another exemplary embodiment of the present disclosure.

FIG. 7 is a perspective view schematically showing a composite electronic component according to another exemplary embodiment of the present disclosure.

Figure 8:
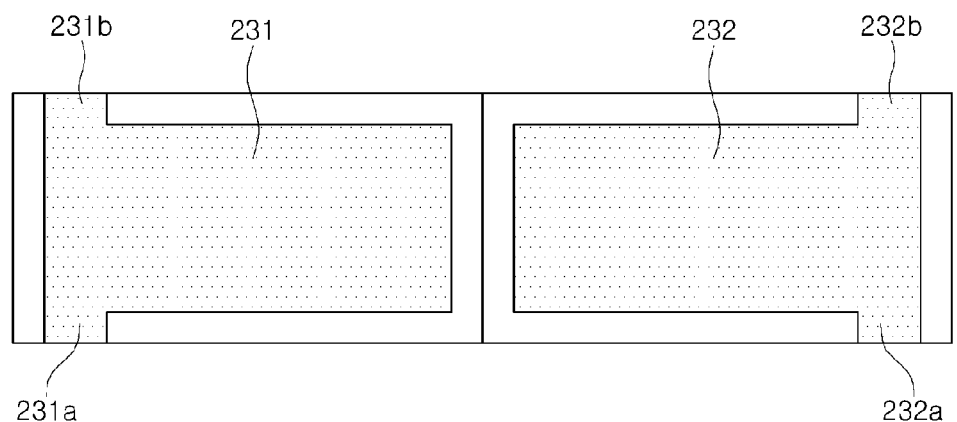
FIG. 8 is a plan view showing an internal electrode applicable to a multilayer ceramic capacitor of the composite electronic component shown in FIG. 7.

FIG. 8 is a plan view showing an internal electrode applicable to a multilayer ceramic capacitor of the composite electronic component shown in FIG. 7.

Referring to FIGS. 7 and 8, a composite electronic component 200 according to another exemplary embodiment of the present disclosure may include: a composite body 230 having a capacitor 210 and an inductor 220 coupled to each other therein, the capacitor 210 including a ceramic body in which a plurality of dielectric layers 211 and first and second internal electrodes 231 and 232 facing each other with the dielectric layers 211 interposed therebetween are stacked, and the inductor 220 including a magnetic body including a coil part; an input terminal 251 formed on a first end surface of the composite body 230 and connected to the coil part of the inductor 220; output terminals 252 including a first output terminal 252a formed on a second end surface of the composite body 230 and connected to the coil part of the inductor 220 and second output terminals 252b formed on upper and lower surfaces of the capacitor 210 of the composite body 230 and connected to lead portions 231a and 231b of the first internal electrode 231 of the capacitor 210; and ground terminals 253 formed on the upper and lower surfaces of the capacitor 210 of the composite body 230 and connected to lead portions 232a and 232b of the second internal electrode 232 of the capacitor 210, wherein the capacitor 210 may be coupled to a side surface of the inductor 220.

The first internal electrode 231 may have the lead portions 231a and 231b exposed to the upper and lower surfaces of the capacitor 210, and the second internal electrode 232 may have the lead portions 232a and 232b exposed to the upper and lower surfaces of the capacitor 210.

The magnetic body may have a form in which a plurality of magnetic layers including conductive patterns formed thereon are stacked, and the conductive patterns may configure the coil part.

The inductor may have a thin film form in which the magnetic body includes an insulating substrate and a coil formed on at least one surface of the insulating substrate.

The magnetic body may include a core and a winding coil wound around the core.

The inductor may be a power inductor.

The capacitor and the inductor may be connected to each other by a conductive adhesive.

In the composite electronic component according to another exemplary embodiment of the present disclosure, since external electrodes of the capacitor 210, that is, the second output terminals 252b and the ground terminals 253 are disposed on the upper and lower surfaces of the capacitor 110, a marker for determining a mounting direction of the component may not be required.

Since other features of the composite electronic component 200 are identical to those of the composite electronic component according to the exemplary embodiment of the present disclosure, a detailed description thereof will be omitted in order to avoid an overlapped description.

Figure 9:
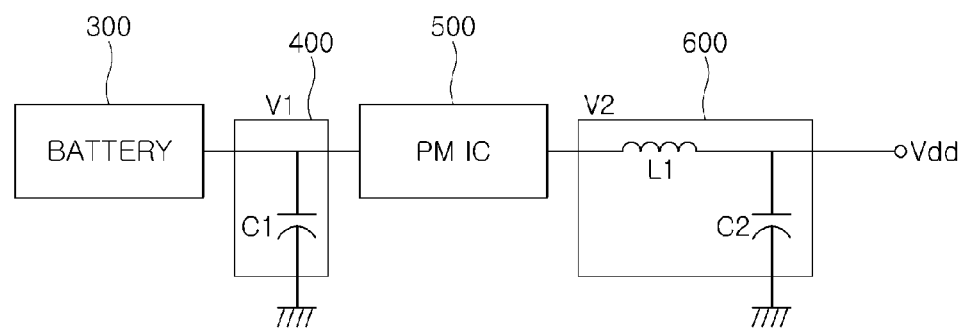
FIG. 9 is a view showing a driving power supplying system supplying driving powder to a predetermined terminal requiring the driving power through a battery and a power managing unit.

FIG. 9 is a view showing a driving power supplying system supplying driving powder to a predetermined terminal requiring the driving power through a battery and a power managing unit.

Referring to FIG. 9, the driving power supplying system may include a battery 300, a first power stabilizing unit 400, a power managing unit 500, and a second power stabilizing unit 600.

The battery 300 may supply power to the power managing unit 500. Here, the power supplied to the power managing unit 500 by the battery 300 will be defined as first power.

The first power stabilizing unit 400 may stabilize first power V1 and supply the stabilized first power to the power managing unit. By way of example, the first power stabilizing unit 400 may include a capacitor C1 formed between a connection terminal of the battery 300 and the power managing unit 500 and a ground. The capacitor C1 may decrease noise included in the first power.

In addition, the capacitor C1 may be charged with charges. In addition, the capacitor C1 may discharge the charges charged therein in a case in which the power managing unit 500 instantaneously consumes a large amount of current, thereby suppressing a voltage variation of the power managing unit 500.

The capacitor C1 may be a high capacitance capacitor in which 300 or more dielectric layers are stacked.

The power managing unit 500 may convert power input to an electronic apparatus into power appropriate for the electronic apparatus and distribute, charge, and control the power. Therefore, the power managing unit 500 may generally include a DC to DC converter.

In addition, the power managing unit may be implemented as a power management integrated circuit (PMIC).

The power managing unit 500 may convert the first power V1 into second power V2. The second power V2 may be required by an active device such as an integrated circuit (IC), or the like, connected to an output terminal of the power managing unit 500 to receive the driving power from the power managing unit 500.

The second power stabilizing unit 600 may stabilize the second power V2 and supply the stabilized second power to an output terminal Vdd. The active device such as an integrated circuit (IC), or the like, receiving the driving power from the power managing unit 500 may be connected to the output terminal Vdd.

By way of example, the second power stabilizing unit 600 may include an inductor L1 connected in series with the power managing unit 500 and the output terminal Vdd therebetween. In addition, the second power stabilizing unit 600 may include a capacitor C2 formed between a connection terminal between the power managing unit 500 and the output terminal Vdd and a ground.

The second power stabilizing unit 600 may decrease noise included in the second power V2.

In addition, the second power stabilizing unit 600 may stably supply the power to the output terminal Vdd.

The inductor L1 may be a power inductor that may be applied to a large amount of current.

The power inductor may be a high efficiency inductor having an inductance change lower than that of a general inductor when direct current (DC) is applied thereto. That is, it may be considered that the power inductor includes DC bias characteristics (inductance change at the time of applying the DC current thereto) as well as functions of a general inductor.

In addition, the capacitor C2 may be a high capacitance capacitor.

Figure 10:
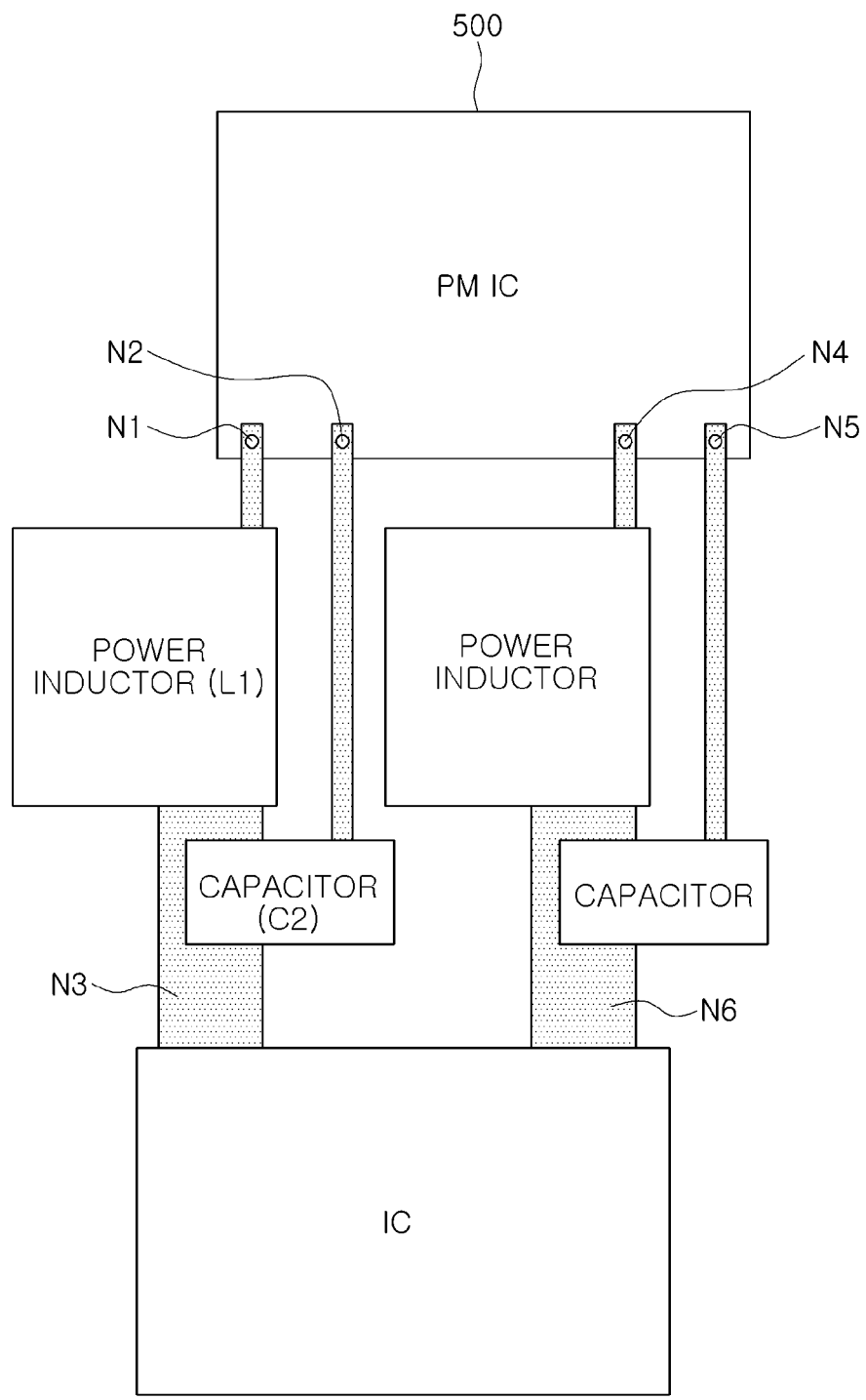
FIG. 10 is a view showing a layout in which the driving power supplying system is disposed.

FIG. 10 is a view showing a layout in which the driving power supplying system is disposed.

Referring to FIG. 10, a layout in which the power managing unit 500, the power inductor L1, and the second capacitor C2 are disposed may be confirmed.

Generally, the power managing unit (PMIC) 500 may include several to several ten DC to DC converters. In addition, in order to implement a function of the DC to DC converter, each of the DC to DC converters may require a power inductor and a high capacitance capacitor.

Referring to FIG. 10, the power managing unit 500 may have predetermined terminals N1 and N2. The power managing unit 500 may receive power from the battery and convert the supplied power using the DC/DC converter. In addition, the power managing unit 500 may supply the converted power via the first terminal N1. The second terminal N2 may be a ground terminal.

Here, since the inductor L1 and the second capacitor C2 may receive the power from the first terminal N1 and stabilize the supplied power to supply driving power through a third terminal N3, the inductor L1 and the second capacitor C2 may serve as the second power stabilizing unit.

Since fourth to sixth terminals N4 to N6 shown in FIG. 10 perform the same functions as those of the first to third terminals N1 to N3, a detailed description thereof will be omitted.

The important fact in designing the layout of the driving power supplying system is that the power managing unit, the power inductor, and the high capacitance capacitor need to be positioned as closely as possible to one another. In addition, designing a short and thick wiring of a power line may be required.

The reason for this is that when the requirements described above are satisfied, an area required for the disposition of a component may be decreased and the occurrence of noise may be suppressed.

In a case in which the number of output terminals of the power managing unit 500 is small, disposing the power inductor and the high capacitance capacitor to be close to each other may be facilitated. However, in a case in which various output terminals of the power managing unit 500 need to be used, the power inductor and the high capacitance capacitor may not be normally disposed due to an increase in density of the component. In addition, a situation in which the power inductor and the high capacitance capacitor need to be disposed in a non-optimal state depending on a priority of power may occur.

For example, since sizes of the power inductor and the high capacitance capacitor are large, a situation in which lengths of a power line and a signal line are inevitably increased at the time of actually disposing the power inductor and the high capacitance capacitor may occur.

In a case in which the power inductor and the high capacitance capacitor are disposed in a non-optimal state, an interval between the power inductor and the high capacitance capacitor and the length of the power line may be increased, such that noise may occur. The noise may have a negative effect on the driving power supplying system.

Figure 11:
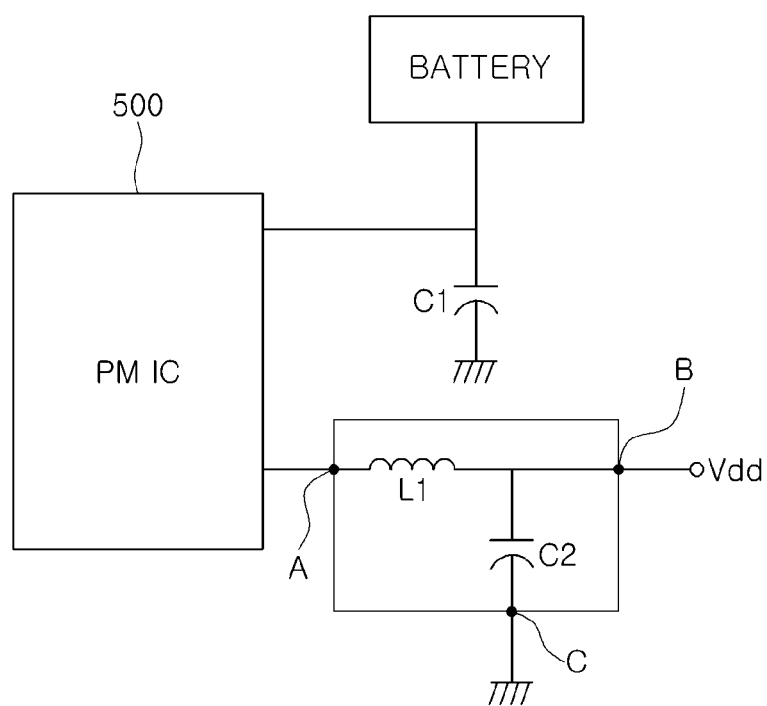
FIG. 11 is a circuit diagram of the composite electronic component according to the exemplary embodiment of the present disclosure.

FIG. 11 is a circuit diagram of the composite electronic component according to the exemplary embodiment of the present disclosure.

Referring to FIG. 11, the composite electronic component may include an input terminal unit A (input terminal), a power stabilizing unit, an output terminal unit B (output terminal), and a ground terminal unit C (ground terminal).

The power stabilizing unit may include the power inductor L1 and the second capacitor C2.

The composite electronic component may be a device capable of serving as a second power stabilizing unit.

The input terminal unit A may receive power converted by the power managing unit 500.

The power stabilizing unit may stabilize power supplied from the input terminal unit A.

The output terminal unit B may supply the stabilized power to the output terminal Vdd.

The ground terminal unit C may connect the power stabilizing unit to the ground.

Meanwhile, the power stabilizing unit may include the power inductor L1 connected between the input terminal unit A and the output terminal unit B and the second capacitor C2 connected between the ground terminal unit C and the output terminal unit.

Referring to FIG. 11, the power inductor L1 and the second capacitor C2 share the output terminal unit B with each other, such that an interval between the power inductor L1 and the second capacitor C2 may be decreased.

As described above, the composite electronic component may be formed by implementing the power inductor and the high capacitance capacitor provided in the power output terminal of the power managing unit 500 as a single component. Therefore, in the composite electronic component, a degree of integration of the elements may be improved.

Figure 12:
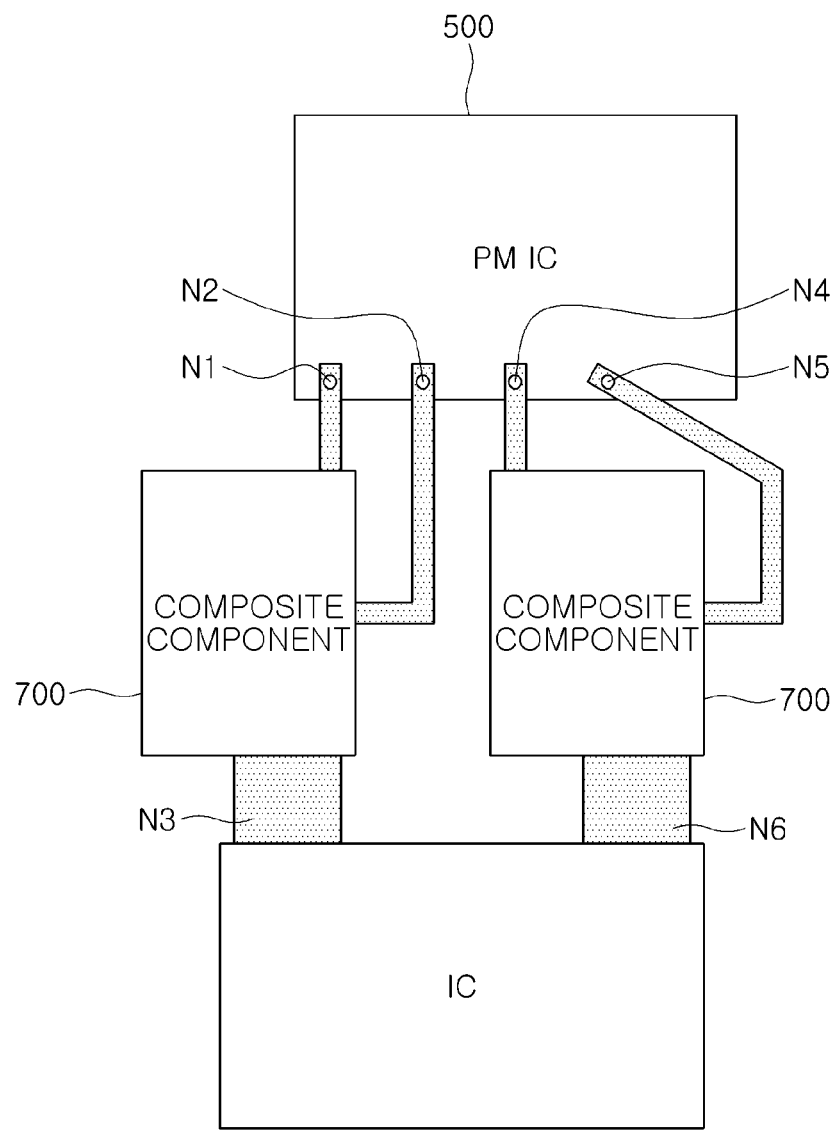
FIG. 12 is a view showing a layout in which the driving power supplying system using the composite electronic component according to the exemplary embodiment of the present disclosure is disposed.

FIG. 12 is a view showing a layout in which the driving power supplying system using the composite electronic component according to the exemplary embodiment of the present disclosure is disposed.

Referring to FIG. 12, it may be confirmed that the second capacitor C2 and the power inductor L1 shown in FIG. 10 are replaced by the composite electronic component according to an exemplary embodiment of the present disclosure.

As described above, the composite electronic component may serve as the second power stabilizing unit.

In addition, a wiring length may be significantly decreased by replacing the second capacitor C2 and the power inductor L1 with the composite electronic component according to an exemplary embodiment of the present disclosure. Further, the number of disposed devices may be decreased, whereby the elements may be optimally disposed.

That is, according to the exemplary embodiment of the present disclosure, the power managing unit, the power inductor, and the high capacitance capacitor may be positioned as closely as possible to one another, and a short and thick wiring of the power line may be designed to thereby decrease noise.

Meanwhile, electronic apparatus manufacturers have made an effort to decrease a size of a printed circuit board (PCB) included in an electronic apparatus in order to satisfy consumers' demand. Therefore, it has been demanded to increase a degree of integration of an IC mounted on the PCB. As in the composite electronic component according to an exemplary embodiment of the present disclosure, a plurality of devices are implemented as a single composite component, whereby such a demand may be satisfied.

Further, according to an exemplary embodiment of the present disclosure, two components (second capacitor and power inductor) are implemented as a single composite electronic component, whereby an area in which they are mounted on the PCB may be decreased. According to an exemplary embodiment of the present disclosure, an area in which components are mounted may be decreased as compared with an existing disposition layout by about 10 to 30%.

Further, according to an exemplary embodiment of the present disclosure, the power managing unit 500 may supply the driving power to the IC through the shortest wiring.

Further, in the composite electronic component according to an exemplary embodiment of the present disclosure, an influence of the inductor on the internal electrode of the capacitor may be significantly decreased by disposing the capacitor on the side surface of the inductor, thereby preventing a change in the self resonant frequency (SRF).

Further, in the composite electronic component according to an exemplary embodiment of the present disclosure, a decrease in Q factor of the component may be prevented by disposing the capacitor on the side surface of the inductor.

In addition, the external electrodes of the capacitor 110, that is, the second output terminal 152b and the ground terminal 153 are disposed on the lower surface of the capacitor 110, such that parasitic capacitance generated between the inductor 120 and the capacitor 110 may be significantly decreased, thereby significantly decreasing a degradation in electrical properties of the composite electronic component.

Board Having Composite Electronic Component Mounted Thereon

Figure 13:
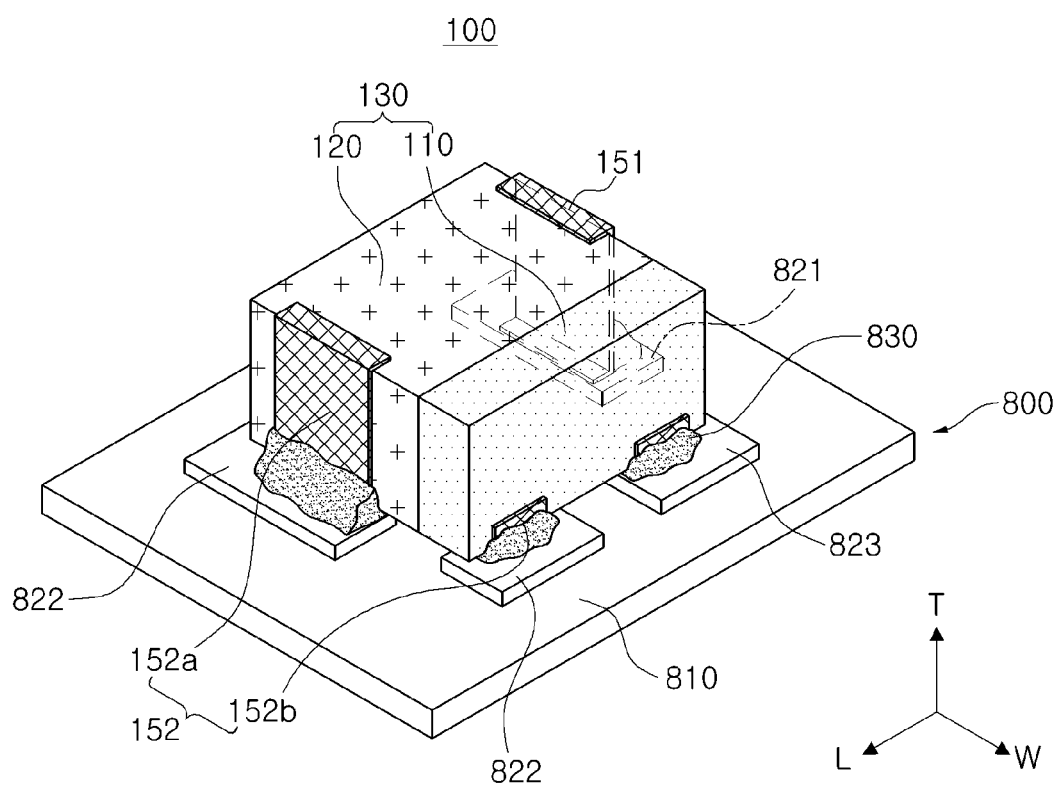
FIG. 13 is a perspective view showing a form in which the composite electronic component of FIG. 1 is mounted on a printed circuit board.

FIG. 13 is a perspective view showing a form in which the composite electronic component of FIG. 1 is mounted on a printed circuit board.

Referring to FIG. 13, a board 800 having the composite electronic component 100 according to an exemplary embodiment of the present disclosure, mounted thereon may include a printed circuit board 810 on which the composite electronic component 100 is mounted, and three or more electrode pads 821 to 823 formed on an upper surface of the printed circuit board 810.

The electrode pads may be configured of the first to third electrode pads 821 to 823 connected to the input terminal 151, the output terminals 152, and the ground terminal 153 of the composite electronic component, respectively.

In this case, the input terminal 151, the output terminals 152, and the ground terminal 153 of the composite electronic component 100 may be electrically connected to the printed circuit board 810 by soldering parts 830, while they are positioned to contact the first to third electrode pads 821 to 823, respectively.

In addition, the composite electronic component mounted on the printed circuit board may be the composite electronic component according to another exemplary embodiment of the present disclosure, and in order to avoid an overlapped description, a detailed description thereof will be omitted.

As set forth above, according to exemplary embodiments of the present disclosure, a composite electronic component requiring a reduced mounting area in a driving power supplying system, and a board having the same mounted thereon may be provided.

In addition, according to exemplary embodiments of the present disclosure, a composite electronic component capable of suppressing the occurrence of noise in a driving power supplying system, and a board having the same mounted thereon may be provided.

Further, in the composite electronic component according to the exemplary embodiment of the present disclosure, since the capacitor is disposed on the side surface of the inductor, the influence of the inductor on the internal electrode of the capacitor may be significantly decreased, thereby preventing a change in the self resonant frequency (SRF).

Further, in the composite electronic component according to the exemplary embodiment of the present disclosure, since the capacitor is disposed on the side surface of the inductor, a decrease in Q factor of the component may be prevented.

Particularly, according to exemplary embodiments of the present disclosure, parasitic capacitance generated between the inductor and the capacitor may be significantly decreased by arranging the external electrodes of the capacitor on the lower surface of the capacitor, thereby significantly decreasing a degradation in electrical properties of the composite electronic component.

While exemplary embodiments have been shown and described above, it will be apparent to those skilled in the art that modifications and variations could be made without departing from the spirit and scope of the present disclosure as defined by the appended claims.

What is claimed is:

1. A composite electronic component comprising:
a composite body having a capacitor and an inductor coupled to each other therein, the capacitor including a ceramic body in which a plurality of dielectric layers and first and second internal electrodes facing each other with the dielectric layers interposed therebetween are stacked, and the inductor including a magnetic body including a coil part;
an input terminal disposed on a first end surface of the composite body and connected to the coil part of the inductor;
output terminals including a first output terminal disposed on a second end surface of the composite body and connected to the coil part of the inductor and a second output terminal disposed on a lower surface of the capacitor of the composite body and connected to a lead portion of the first internal electrode of the capacitor; and
a ground terminal disposed on the lower surface of the capacitor of the composite body and connected to a lead portion of the second internal electrode of the capacitor,
wherein the capacitor is coupled to a side surface of the inductor, and the first and second internal electrodes are disposed to be perpendicular with respect to a mounting surface of the composite body.

2. The composite electronic component of claim 1, wherein the magnetic body has a form in which a plurality of magnetic layers having conductive patterns disposed thereon are stacked, the conductive patterns configuring the coil part.

3. The composite electronic component of claim 1, wherein the inductor has a thin film form in which the magnetic body includes an insulating substrate and a coil disposed on at least one surface of the insulating substrate.

4. The composite electronic component of claim 1, wherein the magnetic body has a form in which a core and a winding coil wound around the core are provided.

5. The composite electronic component of claim 1, wherein the inductor is a power inductor.

6. The composite electronic component of claim 1, wherein the capacitor and the inductor are connected to each other by a conductive adhesive.

7. A board with a composite electronic component mounted thereon, comprising:
a printed circuit board having three or more electrode pads disposed thereon;
the composite electronic component of claim 1 mounted on the printed circuit board; and
soldering parts connecting the electrode pads and the composite electronic component.

8. A composite electronic component comprising:
a composite body having a capacitor and an inductor coupled to each other therein, the capacitor including a ceramic body in which a plurality of dielectric layers and first and second internal electrodes facing each other with the dielectric layers interposed therebetween are stacked, and the inductor including a magnetic body including a coil part;
an input terminal disposed on a first end surface of the composite body and connected to the coil part of the inductor;
output terminals including a first output terminal disposed on a second end surface of the composite body and connected to the coil part of the inductor and second output terminals disposed on upper and lower surfaces of the capacitor of the composite body and connected to lead portions of the first internal electrode of the capacitor; and
ground terminals disposed on the upper and lower surfaces of the capacitor of the composite body and connected to lead portions of the second internal electrode of the capacitor,
wherein the capacitor is coupled to a side surface of the inductor, and the first and second internal electrodes are disposed to be perpendicular with respect to a mounting surface of the composite body.

9. The composite electronic component of claim 8, wherein the first internal electrode has the lead portions exposed to the upper and lower surfaces of the capacitor, and the second internal electrode has the lead portions exposed to the upper and lower surfaces of the capacitor.

10. The composite electronic component of claim 8, wherein the magnetic body has a form in which a plurality of magnetic layers having conductive patterns disposed thereon are stacked, the conductive patterns configuring the coil part.

11. The composite electronic component of claim 8, wherein the inductor has a thin film form in which the magnetic body includes an insulating substrate and a coil disposed on at least one surface of the insulating substrate.

12. The composite electronic component of claim 8, wherein the magnetic body has a form in which a core and a winding coil wound around the core are provided.

13. The composite electronic component of claim 8, wherein the inductor is a power inductor.

14. The composite electronic component of claim 8, wherein the capacitor and the inductor are connected to each other by a conductive adhesive.

15. A board with a composite electronic component mounted thereon, comprising:
a printed circuit board having three or more electrode pads disposed thereon;
the composite electronic component of claim 8 mounted on the printed circuit board; and
soldering parts connecting the electrode pads and the composite electronic component.

16. A composite electronic component comprising:
an input terminal receiving power converted by a power managing unit;
a power stabilizing unit stabilizing the power and including a composite body having a capacitor and an inductor coupled to each other therein, the capacitor including a ceramic body in which a plurality of dielectric layers and first and second internal electrodes facing each other with the dielectric layers interposed therebetween are stacked, the inductor including a magnetic body including a coil part, and the capacitor being coupled to a side surface of the inductor;
output terminals supplying the stabilized power; and
at least one ground terminal for grounding, and the first and second internal electrodes are disposed to be perpendicular with respect to a mounting surface of the composite body.

17. The composite electronic component of claim 16, wherein the input terminal is disposed on a first end surface of the composite body,
the output terminals include a first output terminal disposed on a second end surface of the composite body and connected to the coil part of the inductor and a second output terminal disposed on a lower surface of the capacitor of the composite body and connected to the first internal electrode of the capacitor, and the at least one ground terminal is disposed on the lower surface of the capacitor of the composite body and connected to the second internal electrode of the capacitor.

18. The composite electronic component of claim 16, wherein the input terminal is disposed on a first end surface of the composite body, the output terminals include a first output terminal disposed on a second end surface of the composite body and connected to the coil part of the inductor and second output terminals disposed on upper and lower surfaces of the capacitor of the composite body and connected to the first internal electrode of the capacitor, and the at least one ground terminal is disposed on the upper and lower surfaces of the capacitor of the composite body and connected to the second internal electrode of the capacitor.

19. A board with a composite electronic component mounted thereon, comprising:

a printed circuit board having three or more electrode pads disposed thereon;

the composite electronic component of claim 16 mounted on the printed circuit board; and soldering parts connecting the electrode pads and the composite electronic component.

* * * * *